United States Patent
Ichihashi et al.

(10) Patent No.: US 6,849,550 B2
(45) Date of Patent: Feb. 1, 2005

(54) METHOD FOR MANUFACTURING SEMICONDUCTOR DEVICE

(75) Inventors: Yoshinari Ichihashi, Gifu-ken (JP); Norihiro Ikeda, Gifu-ken (JP); Takashi Gotou, Ushiku (JP); Ryousuke Usui, Ichinomiya (JP); Tatsuya Fujishima, Tsukuba (JP)

(73) Assignee: Sanyo Electric Co. Ltd., Moriguchi (JP)

( * ) Notice: Subject to any disclaimer, the term of this patent is extended or adjusted under 35 U.S.C. 154(b) by 105 days.

(21) Appl. No.: 10/190,756

(22) Filed: Jul. 9, 2002

(65) Prior Publication Data

US 2003/0060053 A1 Mar. 27, 2003

(30) Foreign Application Priority Data

Jul. 10, 2001 (JP) ........................................ 2001-208693

(51) Int. Cl.$^7$ ............................................ H01L 21/302
(52) U.S. Cl. ........................ 438/694; 438/696; 438/700; 438/704; 438/712; 438/723
(58) Field of Search ................................ 438/694, 696, 438/700, 704, 712, 723

(56) References Cited

U.S. PATENT DOCUMENTS 6,110,826 A * 8/2000 Lou et al. .................. 438/674
6,228,755 B1 * 5/2001 Kusumi et al. ............. 438/618

FOREIGN PATENT DOCUMENTS

JP 7169738 7/1995

OTHER PUBLICATIONS

Japan Patent Office Action dated Mar. 30, 2004 in Japanese, App # 2001–208963

* cited by examiner

*Primary Examiner*—Nadine G. Norton
*Assistant Examiner*—Binh X. Tran
(74) *Attorney, Agent, or Firm*—Westerman, Hattori, Daniels & Adrian, LLP

(57) ABSTRACT

A method for manufacturing a semiconductor device that forms a connection hole with high electric reliability even when the semiconductor device is designed to be highly integrated. The semiconductor device includes a lower layer wiring and an interlayer insulation film, which is formed on the lower layer wiring and has a connection hole connected with the lower layer wiring. The method includes forming the connection hole by etching the interlayer insulation film. The connection hole is formed by etching part of the lower layer wiring under a first etching condition through physical reaction in at least the vicinity of the lower layer wiring, and by etching part of the interlayer insulation film under a second etching condition that guarantees a selective ratio relative to the lower layer wiring.

16 Claims, 8 Drawing Sheets

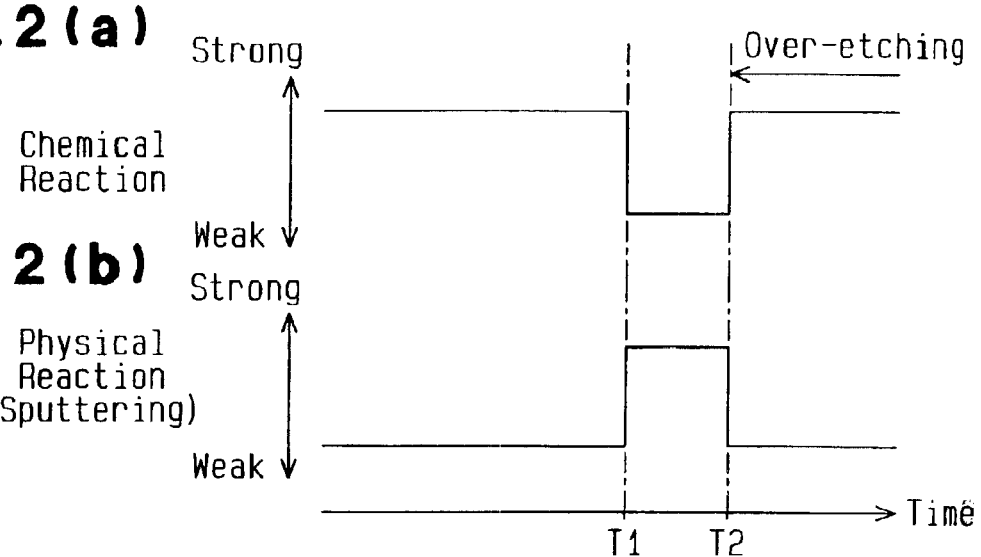
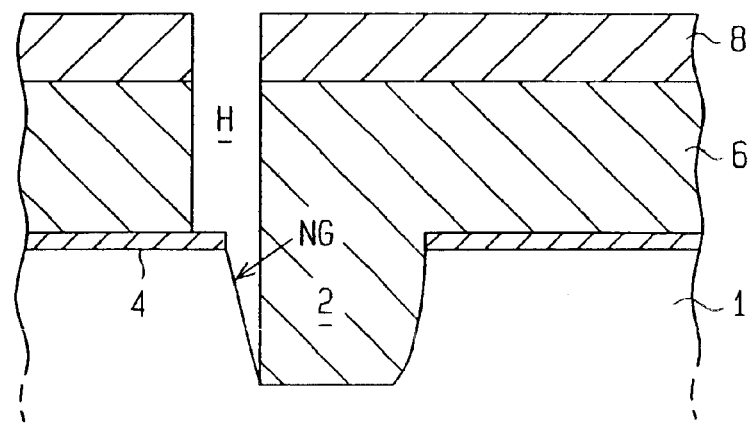

METHOD FOR MANUFACTURING SEMICONDUCTOR DEVICE

BACKGROUND OF THE INVENTION

The present invention relates to a method for manufacturing a semiconductor device, and more particularly, to an improvement of a method for forming a connection hole in an interlayer insulation film to establish contact with a lower layer wiring.

In a semiconductor device, such as a semiconductor integrated circuit, an interlayer insulation film is applied to a lower layer wiring, which includes the gate, drain, and source of a transistor. A connection hole is formed in the interlayer insulation film. Metal is charged in the connection hole to establish contact between the lower layer wiring and an upper layer wiring.

The connection hole is normally formed by performing anisotropic etching, which guarantees a selective ratio relative to the lower layer wiring, on the interlayer insulation film. It is known that excessive etching, or over-etching, of the interlayer insulation film occurs due to differences between lower layer wirings or interlayer insulation films. A connection hole may not be connected with the lower layer wiring due to insufficient etching of the interlayer insulation film even if another connection hole is connected with the lower layer wiring. Therefore, over-etching is performed so that each connection hole is connected with the lower layer wiring.

However, over-etching may be performed on the region adjacent to the lower layer wiring. This may subsequently cause electric connection between unexpected regions and the lower layer wiring when metal is charged in the connection hole. More specifically, misalignment of the lower layer wiring and the connection hole or differences in the pattern size of the lower layer wiring may cause the connection hole to overhang from the lower layer wiring. When the connection hole overhangs from the lower layer wiring, regions adjacent to the lower layer wiring are also etched when over-etching is performed. Accordingly, when metal is charged on the etched region, which is adjacent to the connection hole, the lower layer wiring is electrically connected to unnecessary portions. This may affect the operation of the semiconductor integrated circuit.

Therefore, during the designing of a semiconductor device in the prior art, the size of the lower layer wiring and the arrangement of the connection hole are provided with allowances taking into consideration misalignment of the lower layer wiring and the connection hole. The allowances for the size of the lower layer wiring and the arrangement of the connection hole avoid the above problem. However, this enlarges the area of the lower layer wiring and consequently decreases the integration of the semiconductor integrated circuit.

SUMMARY OF THE INVENTION

It is an object of the present invention to provide a method for manufacturing a semiconductor device that forms a connection hole with high electric reliability even when the semiconductor device is designed to be highly integrated.

To achieve the above object, the present invention provides a method for manufacturing a semiconductor device including a lower layer wiring and an interlayer insulation film, which is formed on the lower layer wiring and has a connection hole connected with the lower layer wiring. The method includes the step of forming the connection hole by etching the interlayer insulation film. The step of forming the connection hole includes etching part of the lower layer wiring under a first etching condition through physical reaction in at least the vicinity of the lower layer wiring, and etching part of the interlayer insulation film under a second etching condition that guarantees a selective ratio relative to the lower layer wiring.

A further perspective of the present invention is a semiconductor device including a first wiring layer, a second wiring layer, and an interlayer insulation film arranged between the first wiring layer and the second wiring layer. A connection hole is formed in the interlayer insulation film to connect the first wiring layer and the second wiring layer. A connection wire is formed in the connection hole. The interlayer insulation film includes an air layer adjacent to the connection wire. An insulation film is formed on a wall of the connection hole to separate the connection wire and the air layer.

A further perspective of the present invention is a method for manufacturing a semiconductor device. The method includes the steps of preparing a wiring layer, and forming an interlayer insulation film on the wiring layer. The interlayer insulation film includes an upper layer, a lower layer and an intermediate layer formed between the upper and lower layers. The method further includes forming a connection hole connected with the wiring layer in the interlayer insulation film, forming an air layer by etching the intermediate layer through the connection hole while guaranteeing a selective ratio relative to the upper layer and the lower layer, forming an insulation wall on a surface that defines the connection hole, and forming the connection wire in the connection hole adjacent to the insulation wall.

A further perspective of the present invention is a method for manufacturing a semiconductor device. The method includes the steps of preparing a wiring layer, forming an interlayer insulation film that includes a pattern insulation film, which has a predetermined pattern and is made of a material that differs from that of the interlayer insulation film, and forming a connection hole in the interlayer insulation film. At least part of the connection hole is connected with the pattern insulation film and to the wiring layer. The method further includes forming an air layer by etching the pattern insulation film through the connection hole while guaranteeing a selective ratio relative to the interlayer insulation film, forming an insulation wall on a surface that defines the connection hole, and forming a connection wire adjacent to the insulation wall in the connection hole.

A further perspective of the present invention is a method for manufacturing a semiconductor device. The method includes the steps of preparing a wiring layer, forming an interlayer insulation film that includes a pattern insulation film, which has a predetermined pattern and is made of a material that differs from that of the interlayer insulation film, forming an opening in the interlayer insulation film that is connected with a lower surface of the patter insulation film, forming an air layer by etching the pattern insulation film through the opening while guaranteeing a selective ratio relative to the interlayer insulation film, and charging metal in the air layer and the opening.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIGS. 2(a) and 2(b) are time charts indicating etching conditions in the manufacturing method of the first embodiment;

FIG. 3 is a cross-sectional view showing a semiconductor device of a comparative example in which an opening is formed in an interlayer insulation film by over-etching;

DETAILED DESCRIPTION OF THE PREFERRED EMBODIMENTS

Figure 1:
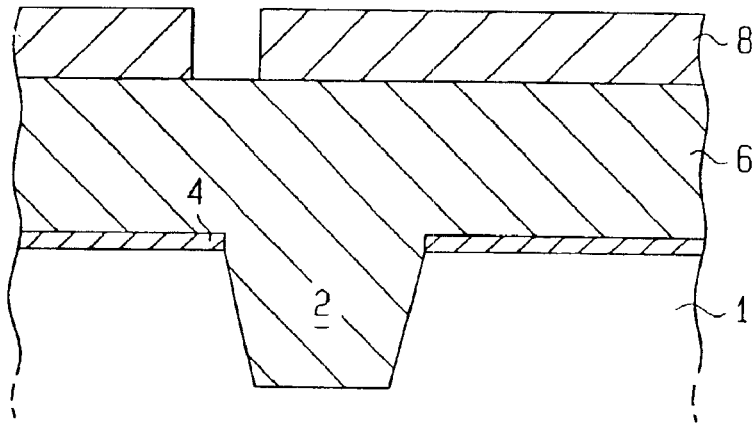
FIGS. 1(a) to 1(c) are cross-sectional views illustrating a procedure for manufacturing a semiconductor device according to a first embodiment of the present invention.
Figure 1:
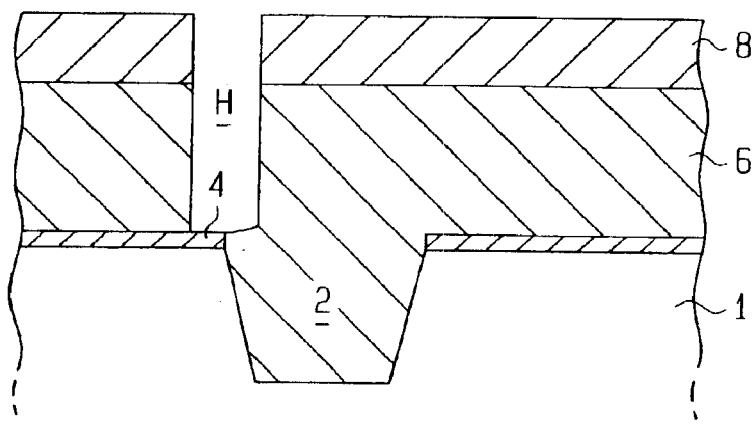
Figure 1:
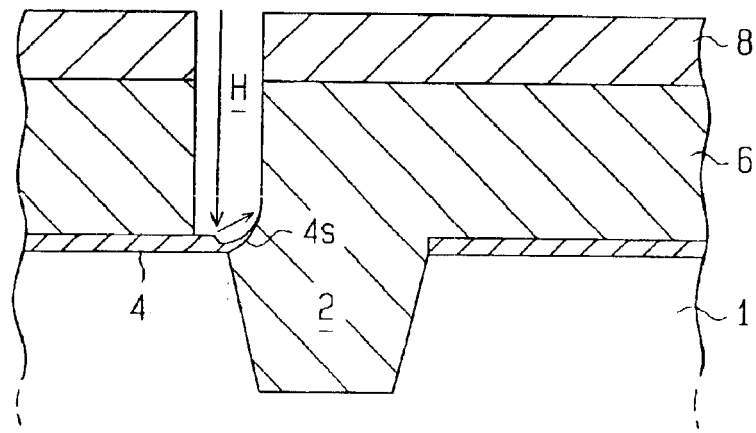

In the drawings, like numerals are used for like elements throughout.

A method for manufacturing a semiconductor device according to a first embodiment of the present invention will now be discussed with reference to the drawings.

FIG. 1(a) is a partial cross-sectional view showing a semiconductor device that is undergoing manufacturing. As shown in FIG. 1(a), an element separation groove 2, a gate 4, and an interlayer insulation film 6 are sequentially formed on a semiconductor substrate 1. Then, a resist pattern 8 is applied to the interlayer insulation film 6 to form an opening in the interlayer insulation film 6 and establish contact between the gate 4 and the upper wiring layer. In the first embodiment, the gate 4 has a silicide configuration, such as Ti, Co, or Ni. Further, the interlayer insulation film 6 is formed from a silicon oxidation film.

Reactive ion etching is normally performed to form an opening in the interlayer insulation film 6. Reactive ion etching is performed by using an etching gas, which is generated by ionizing active gas chemically reacting to the interlayer insulation film 6 and includes reactive ion species having a directional property. While guaranteeing the selective ratio relative to the gate 4 with the reactive ion species (i.e., the reactive ion species having a directional property), which enables anisotropic etching through physical reaction and chemical reaction, the interlayer insulation film 6 is etched by undergoing sputtering (physical reaction) and chemical reaction.

The etching gas may include inert gas to increase the etching speed. In such a case, the physical and chemical reaction using active gas and the physical reaction (sputtering) using inert gas are adjusted to perform anisotropic etching of the interlayer insulation film 6 while guaranteeing the selective ratio relative to the gate 4.

As shown in FIG. 1(a), misalignment between the opening of the resist pattern 8 and the gate 4 results in a drawback as described in the prior art section. More specifically, misalignment of the resist pattern 8 and the gate 4 causes a connection hole, which is formed in the interlayer insulation film 6, to overhang from the gate 4. When the connection hole overhangs from the gate 4, regions adjacent to the gate 4 are etched when over-etching is performed.

Accordingly, the following operations are performed when forming the connection hole in the interlayer insulation film 6.

(a) The interlayer insulation film 6 is etched under a first etching condition, which enables sputtering of the gate 4 through physical reaction in the vicinity of the upper surface of the gate 4.

(b) After performing operation (a), the interlayer insulation film 6 is etched under a second etching condition, which guarantees the selective ratio relative to the gate 4.

In operation (a), the gate 4, which upper surface becomes exposed by etching the interlayer insulation film 6, is physically cut away (sputtered) under the first etching condition. The sputtered material of the gate 4 adheres to the wall of the opening in the interlayer insulation film 6.

Then, when over-etching is performed in operation (b), the material of the gate 4 adhered to the wall of the opening in the interlayer insulation film 6 serves as an etching inhibition film. This inhibits the etching of the interlayer insulation film 6.

More specifically, in operations (a) and (b) of the first embodiment, the rate (level) between physical etching and chemical etching in reactive ion etching is adjusted.

In operation (a), priority is given to the physical reaction to guarantee the sputtering of the upper surface of the gate 4. In this state, the energy of the inert gas is significantly greater than the energy of the inert gas under an etching condition that guarantees the selective ratio relative to the gate 4.

In operation (b), priority is given to the chemical reaction to perform over-etching. In this case, the energy of the inert gas is set to be less than the energy in operation (b). This guarantees over-etching of the interlayer insulation film 6 while guaranteeing the elective ratio relative to the gate 4.

In this manner, since etching is performed while adjusting the ratio between the physical reaction and the chemical reaction during reactive ion etching, the transition of each operation is smoothly performed.

More specifically, fluorocarbon gas is used as the active gas to etch the interlayer insulation film 6, which is formed from a silicon oxide film. Argon gas is used as the inert gas.

The formation of the opening in the interlayer insulation film 6 will further be discussed with reference to FIGS. 1 and 2.

Referring to FIG. 1(a), when the resist pattern 8 is formed on the interlayer insulation film 6, etching is started using the resist pattern 8 as a mask. FIG. 2 is a time chart illustrating the etching conditions. When etching is started, etching that gives priority to chemical reactions is performed until time T1 (FIG. 1(b)) at which it is presumed that the upper surface of the gate 4 will become exposed. At time T1, etching is temporarily performed giving priority to physical reaction to sputter the upper surface of the gate 4. That is, etching is performed with an energy that is greater than the energy of the etching condition until time T1. In other words, etching is performed with inert gas at a sputtering rate that is greater than the etching rate of the etching condition until time T1. This sputters the upper surface of the gate 4. The sputtered gate material adheres to the surface of the gate 4 exposed by the connection hole H and to the wall of the connection hole H.

In this state, electron cyclotron resonance (ECR) plasma etching is performed under the first etching condition, which is shown below.

| | |
|---|---|
| Pressure | 0.655 Pa |
| Plasma Power | 1550 W |
| Power of Bias Application Voltage | 400 W |
| Flow Rate of $C_4F_8$ | $3.0 \times 10^{-2} m^3/min$ (standard state) |
| Flow Rate of $O_2$ | $8.0 \times 10^{-3} m^3/min$ (standard state) |
| Flow Rate of Ar | $5.0 \times 10^{-1} m^3/min$ (standard state) |

At time T2, at which it is presumed that an inhibition film (denoted by 4s in FIG. 1(c)) is formed on the surface of the gate 4 exposed by the connection hole H and on the wall of the connection hole H, the etching condition is switched to guarantee the selective ratio relative to the gate 4. This selectively over-etches the interlayer insulation film 6. In other words, etching is performed with inert gas at a sputtering rate that is lower than the rate under the etching condition until time T2. Such etching prevents regions adjacent to the gate from being etched during over-etching even when the connection hole H overhangs from the gate 4.

In this state, ECR plasma etching is performed under the second etching condition, which is shown below.

| | |
|---|---|
| Pressure | 0.931 Pa |
| Plasma Power | 1550 W |
| Power of Bias Application Voltage | 200 W |
| Flow Rate of $C_4F_8$ | $3.0 \times 10^{-2} m^3/min$ (standard state) |
| Flow Rate of $O_2$ | $6.0 \times 10^{-3} m^3/min$ (standard state) |
| Flow Rate of Ar | $2.5 \times 10^{-1} m^3/min$ (standard state) |

As apparent from above, to increase the sputtering rate, at least one of the following procedures is performed.

a. Decrease the ambient pressure during ECR plasma etching.

b. Increase the intensity of the bias application voltage.

c. Increase the flow rate of the inert gas that performs sputtering.

To decrease the sputtering rate, the opposite of procedures a to c may be performed.

In this manner, the adjustment of the sputtering rate enables over-etching to be properly performed in the first embodiment. In comparison, in a comparative example shown in FIG. 3 in which over-etching is also performed under an etching condition that guarantees the selective ratio relative to the gate 4, excessive etching is performed (as denoted by NG in FIG. 3).

The method for manufacturing a semiconductor device in the first embodiment has the advantages described below.

(1) When forming an opening in the interlayer insulation film, after performing sputtering under the first etching condition that sputters the gate 4, over-etching is performed under the second etching condition while guaranteeing the selective ratio relative to the gate 4. This forms the inhibition film on the surface of the gate 4 exposed by the connection hole H and the wall of the connection hole H. Thus, over-etching is performed properly.

(2) An argon gas, which is an inert gas, is added as an etching gas. This enables sputtering of the gate 4 to be performed optimally and increases the etching speed of the interlayer insulation film 6.

The first embodiment may be modified as described below.

The etching condition that adjusts the sputtering rate using the inert gas is not restricted to the example of the above embodiment and may be changed as required.

The adjustment of the sputtering rate using inert gas does not have to be performed through the above procedures a to c.

The ratio adjustment between the physical reaction and chemical reaction does not have to be performed in the manner shown in FIG. 2. For example, etching may be performed under the first etching condition that sputters the gate during the period from when etching is started to when over-etching is about to be performed.

The above etching gas does not necessarily have to be used for reactive ion etching. It is only required that the inert gas be capable of etching the interlayer insulation film 6 while guaranteeing the selective ratio of the gate 4. Further, the inert gas does not have to be used. In such a case, the upper surface of the gate 4 is sputtered by giving priority to the physical reaction in operation (a), and etching that guarantees the selective ratio relative to the gate 4 is performed in operation (b).

The etching of the interlayer insulation film 6 does not have to be performed through reactive ion etching. For example, in operation (a), only physical sputtering may be performed. In this state, an appropriate etching that guarantees the selective ratio relative to the gate 4 is performed in operation (b). Alternatively, by performing ion beam etching, the gate 4 may be sputtered through physical reaction in operation (a), and etching that guarantees the selective ratio relative to the gate 4 may be performed in operation (b).

The lower layer wiring, which establishes contact through the interlayer insulation film 6, is not limited to the gate 4 of the above embodiment and may be, for example, a drain, a source, an electrode terminal of a diode, or wiring between elements.

Further, the lower layer wiring is not required to have the above silicide structure. For example, the lower layer wiring may be formed from polycrystalline silicon, amorphous silicon, or a metal, such as, aluminum, aluminum alloy, tungsten, titanium, or tantalum. Alternatively, the lower layer wiring may be formed from a compound of polycrystalline silicon, amorphous silicon, silicide, aluminum, aluminum alloy, tungsten, titanium, or tantalum (e.g. a nitride of the above materials).

A semiconductor device according to a second embodiment of the present invention will now be discussed. In the second embodiment, the semiconductor device has an air layer formed between wiring layers.

Due to the higher integration of devices in a semiconductor device, it is required that the capacitance between wires be decreased and that the permittivity of the interlayer insulation film be decreased. Thus, in the prior art, an air layer is provided between the wiring layers to decrease the permittivity of the interlayer insulation film.

As described in, for example, Japanese Laid-Open Patent Publication No. 8-30578, the air layer is formed through the following operations.

(a) Formation of an interlayer insulation film that includes an intermediate layer and an upper and lower layer, which are made of a material differing from that of the intermediate layer.

(b) Formation of a connection wire by forming an opening in the interlayer insulation film to establish contact between the upper and lower wiring layers.

(c) Selective etching of the intermediate layer to remove the intermediate layer after forming an opening that extends from the upper layer to the intermediate layer.

If the air layer is formed after the connection wire is formed, the connection wire may corrode and break during the air layer formation operation. If the connection wire is formed after the air layer is formed, the material of the connection wire comes into contact with the air layer. Thus, a metal material cannot be properly charged in the opening. To apply a metal material to the wall of the opening, a thin metal film (seed film) is normally applied to the wall of the opening and the seed film is used as a core on which the connection wire grows. However, the air layer produces a space in the wall of the opening. Thus, the seed film cannot be formed. In such manner, it is difficult to accurately form the connection wire in the opening after the air layer is formed.

In the second embodiment, the electric reliability between wiring layers is guaranteed in the following manner when forming the air layer.

Figure 4A:
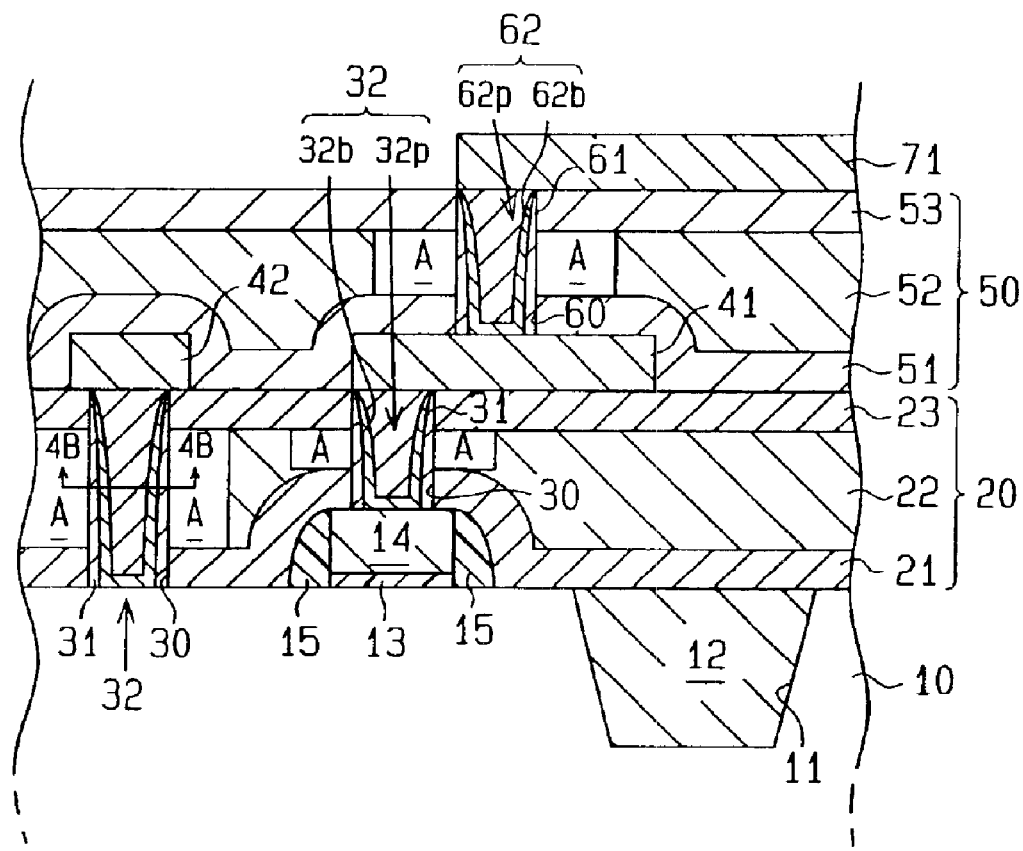
FIG. 4(a) is a cross-sectional view of a semiconductor device according to a second embodiment of the present invention.

As shown in FIG. 4(a), the semiconductor device has an element separation groove 11 formed in a semiconductor substrate 10. An insulation body 12 is embedded in the element separation groove 11 to form an element separation region, which separates the semiconductor substrate 10 into element regions. Elements, such as a gate insulation film 13, a polysilicon gate 14, and spacers 15 formed about the sides of the gate insulation film 13 and the polysilicon gate 14, are formed in the element region.

An interlayer insulation film 20 covers the upper side of the semiconductor substrate 10, on which the elements are formed. The interlayer insulation film 20 includes a lower layer 21, an upper layer 23, and an intermediate layer 22, which is formed from a material differing from that of the lower layer 21 and the upper layer 23. The upper layer 23 and the lower layer 21 are tetraethylorthosilicate (TEOS) films. The intermediate layer 22 is a spin-on glass (SOG) film.

Wires 41, 42 are formed on the interlayer insulation film 20. Connection holes 30 are formed in the interlayer insulation film 20 to establish contact between the wires 41, 42 and the elements on the semiconductor substrate 10 (i.e., to establish contact between the upper and lower wiring layers of the interlayer insulation film 20). To electrically connect the upper and lower wiring layers, a connection wire 32 is formed in each connection hole 30. The connection wire 32 includes a barrier metal 32b, which is formed from titanium nitride (TiN), and tungsten (W) 32p.

An air layer A is formed next to each connection wire 32 so as to surround the outer surface of the connection wire 32. More specifically, the air layer A formed in the intermediate layer 22 is adjacent to the connection wires 32 (connection holes 30) and have an upper side and a lower side, which are respectively connected with the upper layer 23 and the lower layer 21.

Figure 4B:
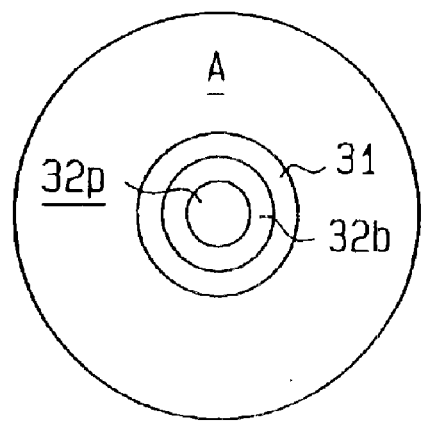
FIG. 4(b) is an enlarged cross-sectional view of the semiconductor device of FIG. 4(a) taken along line 4B-4B.

A TEOS insulation film 31 is applied to the outer surface of each connection wire 32. The insulation film 31 separates the connection wire 32 from the air layer A. FIG. 4(b) shows the cross-section of the connection wire 32, the insulation film 31, and the air layer A taken along line 4B-4B in FIG. 4(a).

Since the insulation film 31 separates the air layer A from the connection wire 32, the seed film is accurately formed when forming the connection wire 32 in the connection hole 30. Further, wiring layers are electrically connected to each other in a preferable manner.

Referring to FIG. 4(a), an interlayer insulation film 50 and a wire 71 are sequentially formed on the wires 41, 42. A connection wire 62 is formed between the wire 71 and the wire 41. The interlayer insulation film 50 includes a lower layer 51 and an upper layer 53, which are formed from non-doped silicate glass (NSG), and an intermediate layer 52, which is formed from spin-on glass (SOG). The insulation film 61 is also formed from NSG.

The procedure for manufacturing the semiconductor device will now be discussed.

Figure 5A:
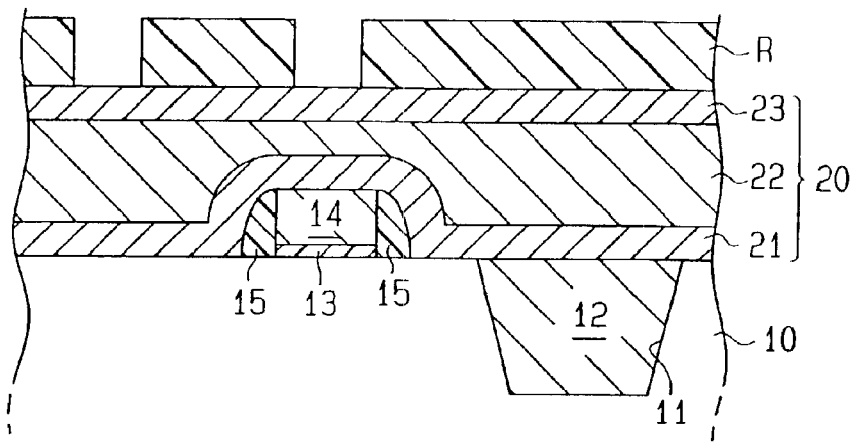
FIGS. 5(a) to 5(f) illustrate a procedure for manufacturing the semiconductor device in the second embodiment.

Referring to FIG. 5(a), a resist R is formed on the interlayer insulation film 20 to form the connection hole. To form the interlayer insulation film 20, low pressure chemical vapor deposition (LPCVD) is first performed to form the lower layer 21, and the intermediate layer 22 is then formed. Finally, LPCVD is performed to form the upper layer 23.

Figure 5B:
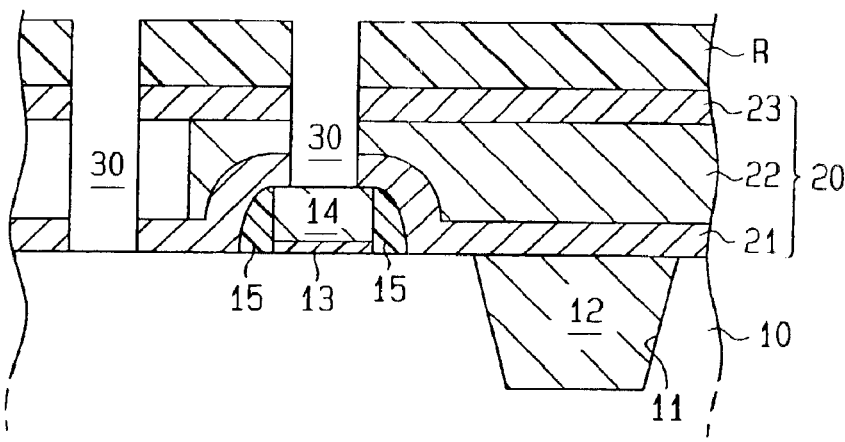
Figure 5C:
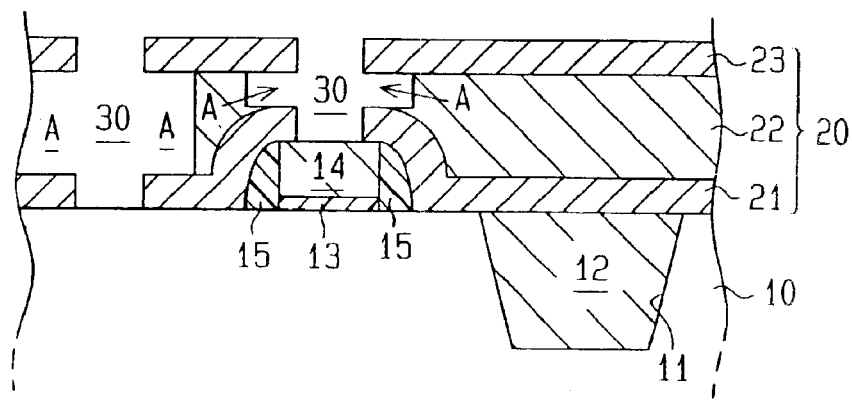

Subsequently, referring to FIG. 5(b), anisotropic etching is performed using the resist R as a mask to form the connection holes 30. Further, referring to FIG. 5(c), the intermediate layer 22 is selectively etched and removed through the connection hole 30 to form the air layer A by performing isotropic dry etching with hydrofluoric-containing solution. FIG. 5(c) shows the cross-section after the resist R is removed.

Figure 5D:
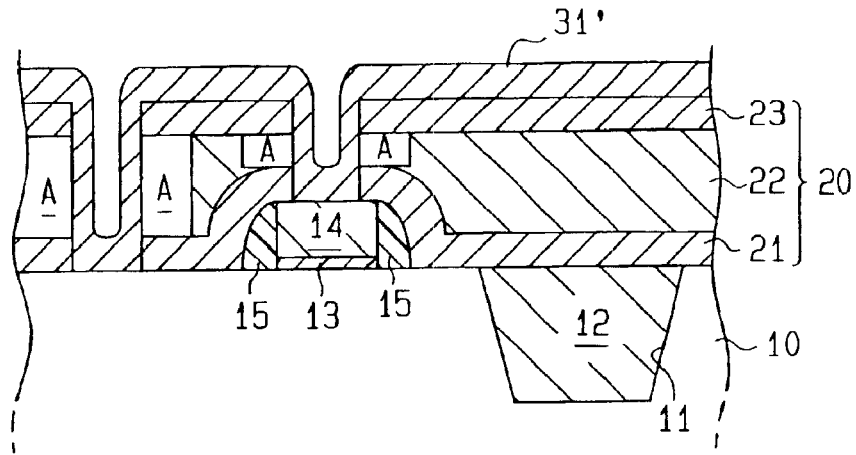
Figure 5E:
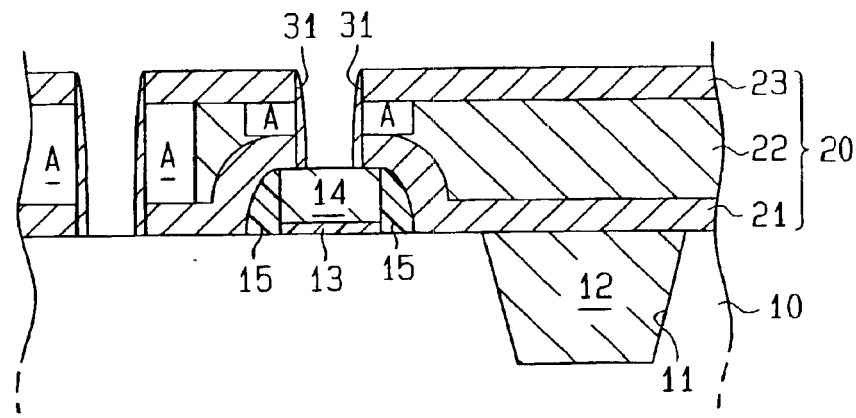

Referring to FIG. 5(d), an insulation material 31' formed from TEOS is deposited on the entire device surface. Referring to FIG. 5(e), anisotropic dry etching is performed on the insulation film 31' to form an insulation film 31 on the inner surface of the connection hole 30.

Figure 5F:
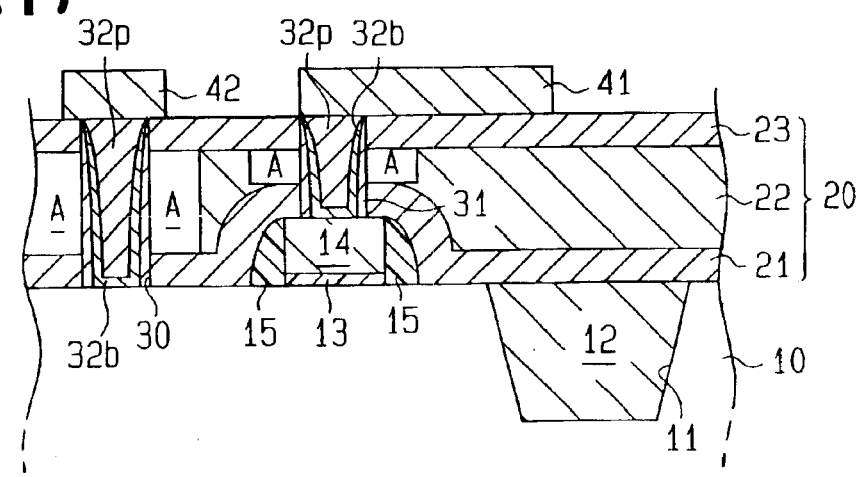

By forming the insulation film on the wall of the connection hole 30 in this manner, the connection wire 32 is accurately formed even when the air layer A is provided. Thus, by forming the seed film using the insulation film 31, the connection wire 32 is formed with the insulation film 31 functioning as a core. After the formation of the seed film, a TiN film is formed. Then, CVD is performed to form a tungsten film. Finally, chemical mechanical polishing (CMP) is performed to flatten the upper surface of the films. This completes the formation of the connection wire 32. Wires 41, 42 are formed above the connection wire 32 as shown in FIG. 5(f).

Then, the interlayer insulation film 50, the connection hole 60, the connection wire 62, and the wire 71 are formed as shown in FIG. 4(a). Plasma CVD is performed to form the lower and upper layers 51, the material of which is NSG.

The method for manufacturing a semiconductor device in the second embodiment has the advantages described below.

(1) The connection wires 32, 62 are formed after separating the connection holes 30, 60 from the air layer A with the insulation films 31, 61. This accurately forms the connection wire.

(2) The interlayer insulation films 20, 50 each include upper and lower layers and an intermediate layer formed from a material that differs from that of the upper and lower layers. This easily forms the air layer A by performing etching that guarantees the selective ratio relative to the upper and lower layers.

A method for manufacturing a semiconductor device according to a third embodiment of the present invention will now be discussed. The third embodiment performs the following operations.

(a) Formation of a pattern insulation film in an interlayer insulation film. The pattern insulation film has a predetermined pattern and is formed from a material that differs from that of the interlayer insulation film. (The pattern insulation film does not contact the upper and lower surfaces of the interlayer insulation film.)

(b) Formation of a connection hole in the interlayer insulation film so that part of the connection hole is connected with the pattern insulation film.

(c) Formation of an air layer by etching the pattern insulation film through the connection hole while guaranteeing the selective ratio relative to the interlayer insulation film. By forming the pattern insulation film in such manner, the characteristic for controlling the shape of the air layer is improved.

The procedure for manufacturing the semiconductor device of the third embodiment will now be discussed.

Figure 6A:
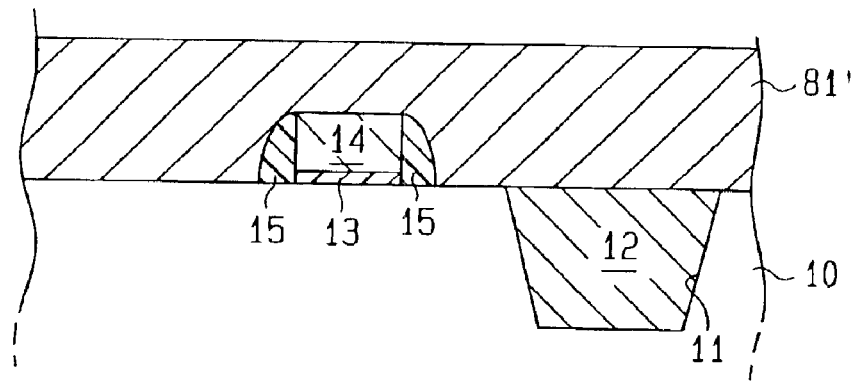
FIGS. 6(a) to 6(f) illustrate a procedure for manufacturing the semiconductor device in a third embodiment according to the present invention.
Figure 6B:
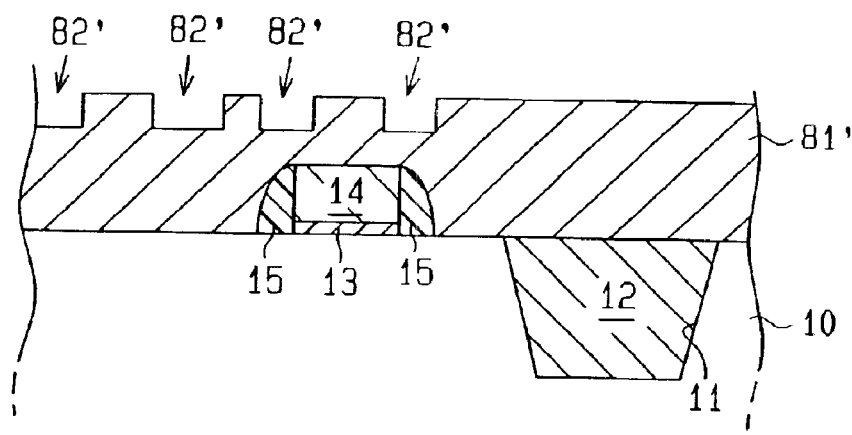
Figure 6C:
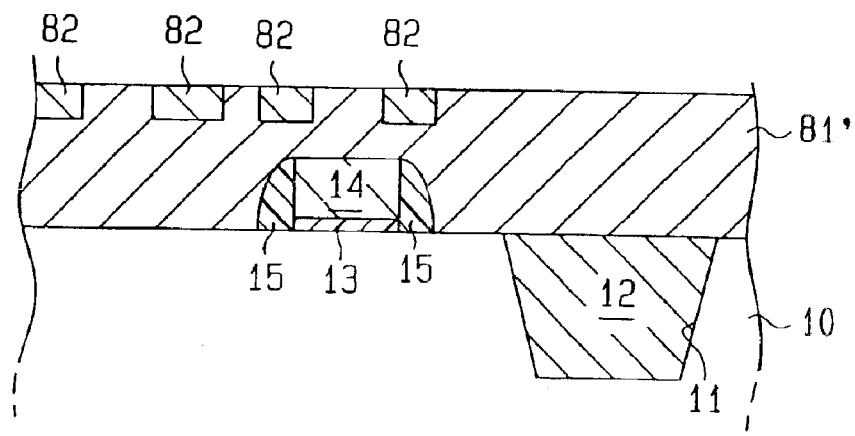

Referring to FIG. 6(a), a TEOS film 81' is deposited and flattened on a semiconductor substrate 10. A gate 14 is formed on the semiconductor substrate 10. Referring to FIG. 6(b), parts of the TEOS film 81' are then etched to form pattern openings 82'. The pattern openings 82' include at least portions that form the above pattern insulation film. The pattern openings 82' may also include the location where the connection hole is formed. Then, an organic SOG film is deposited on the TEOS film 81' and flattened by performing CMP to form a pattern insulation film 82, as shown in FIG. 6(c).

Figure 6D:
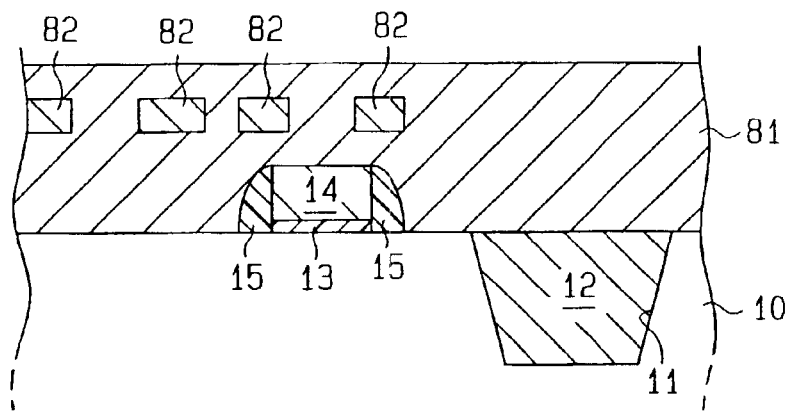
Figure 6E:
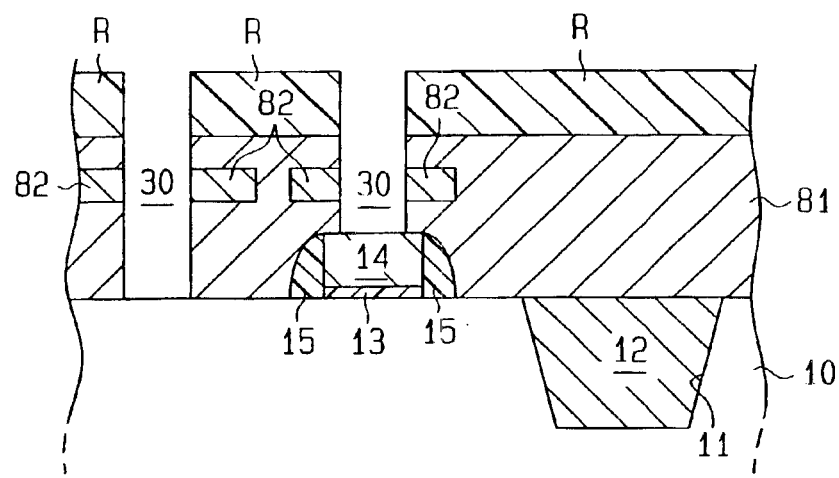
Figure 6F:
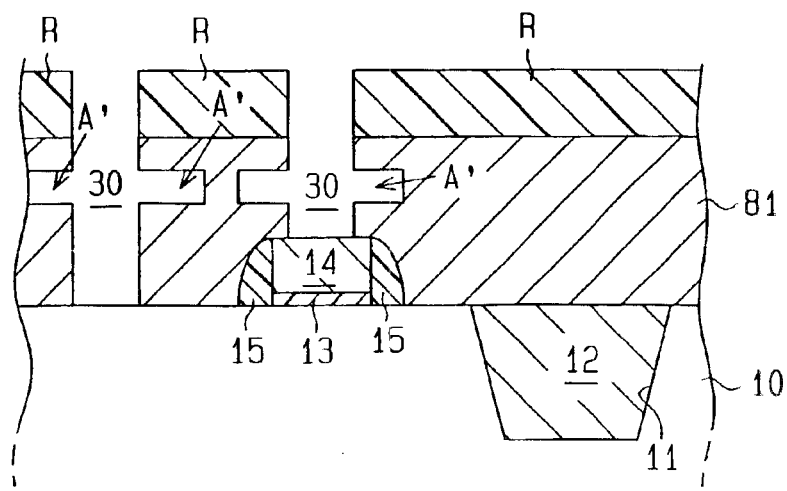

TEOS is deposited on the TEOS film 81' and the pattern insulation film 82 to form the interlayer insulation film 81 as shown in FIG. 6(d). Then, referring to FIG. 6(e), the interlayer insulation film 81 is etched using a resist R as a mask to form a connection hole 30. When the connection hole 30 is formed in this manner, the pattern insulation film 82 is selectively removed through the connection hole 30 to form an air layer A', as shown in FIG. 6(f). For example, a hydroxylamine solution is used to form the air layer A'.

The third embodiment has the advantages described below.

A pattern insulation film having a predetermined pattern and made of a material that differs from that of the interlayer insulation film is formed in the interlayer insulation film. The pattern insulation film is selectively etched and removed to form the air layer. This improves the characteristic for controlling the shape of the air layer.

In a method for manufacturing a semiconductor device according to a fourth embodiment of the present invention, a further interlayer insulation film including air layer is formed on the interlayer insulation layer, which includes an air layer, of the second and third embodiments. Metal is charged in the air layer to form, for example, a capacitor. After the operations of the third embodiment are completed, the following operations are performed.

Formation of a pattern insulation film in an interlayer insulation film. The pattern insulation film has a predetermined pattern and is formed from a material that differs from that of the interlayer insulation film.

Formation of openings, which are connected with the lower surface of the pattern insulation film, in the interlayer insulation film.

Formation of air layer by etching the pattern insulation film through the openings while guaranteeing the selective ratio relative to the interlayer insulation film.

Charging of metal into the air layer and the openings.

Figure 7:
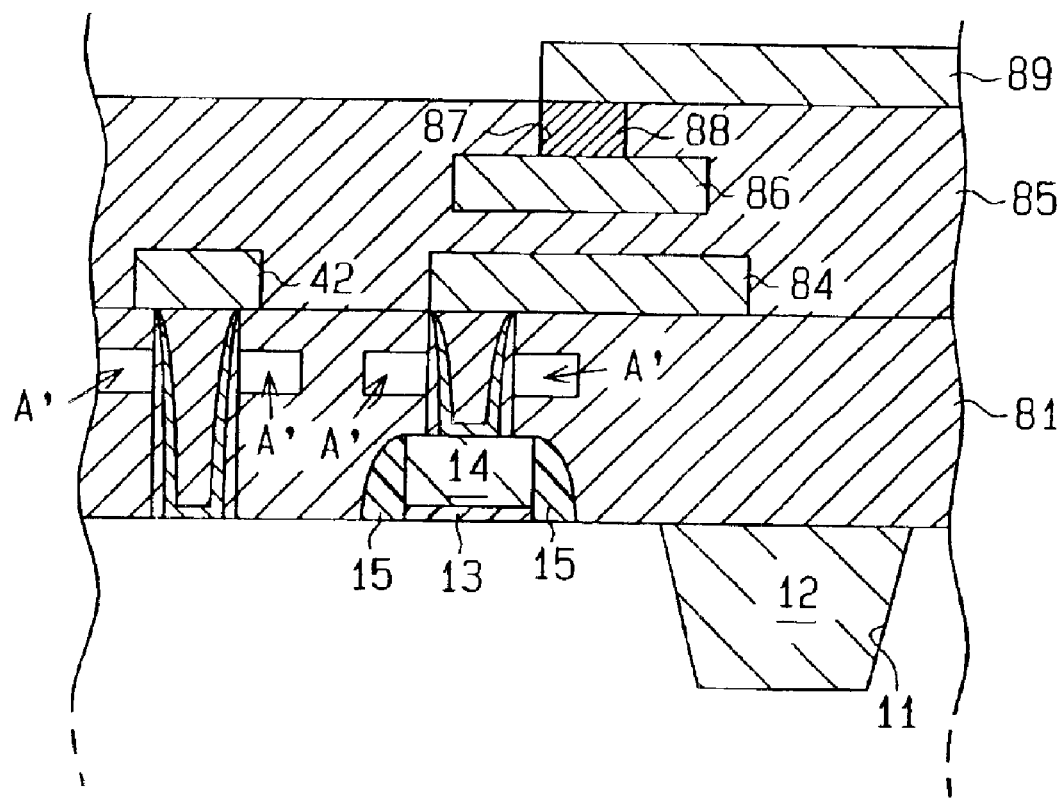
FIG. 7 is a cross-sectional view of a semiconductor device according to a fourth embodiment of the present invention.

FIG. 7 is a cross-sectional view of a semiconductor device having a capacitor formed in an interlayer insulation film 85. The capacitor includes an electrode 84, an electrode 86, and an interlayer insulation film 85. An air layer A' is formed in an interlayer insulation film 81 by performing the operations illustrated in FIGS. 6(a) to 6(d). The capacitor is formed as described below.

An organic SOG is applied to a pattern insulation film to form the electrode 86 in the interlayer insulation film 85, which is made of TEOS. An opening 87, which extends to the lower surface of the pattern insulation film, is formed in the interlayer insulation film 85. Then, the organic SOG is etched to remove part of the interlayer insulation film 85 and the pattern insulation film. Metal is charged in the opening 87 and the portion from which the pattern insulation film has been removed to form the electrode 86 and a wire 88. The wire 88 is electrically connected to a wire 89 formed on the interlayer insulation film 85.

In the fourth embodiment, the wire 88 and the electrode 86 are simultaneously formed. This decreases the number of operations required to form the capacitor.

The second to fourth embodiments may be modified as described below.

The interlayer insulation film of the second embodiment is not necessarily limited to the above structure. It is only required that the insulation layer be formed from at least three layers, an upper layer, a lower layer, and an intermediate layer, which is formed from a material that is the same as that of the upper and lower materials. When the intermediate layer is etched, the layers forming the upper and lower surfaces of the interlayer insulation film use a film that guarantees the selective ratio relative to the intermediate layer.

The materials of the intermediate layer and the upper and lower layers is not limited to those described above. When using an organic insulation film as the intermediate layer, it is preferred that the intermediate layer be etched by the plasma in oxygen gas.

The pattern insulation film is not limited to the organic SOG film. When using the organic insulation film, it is preferred that the pattern insulation film be etched by the plasma of oxygen gas or by an organic solution.

The pattern insulation film does not have to be formed as illustrated in FIGS. 6(a) to 6(d). For example, the pattern insulation film may be formed by the following steps:

forming a first film, which serves as the interlayer insulation film;

forming a pattern insulation film on the first film by etching a film on the first film; and forming a second film, which serves as the interlayer insulation film; on the pattern insulation film and the first film. The first and second films do not necessarily have to be made of the same material as long as they are made of a material differing from that of the pattern insulation film and guarantee the selective ratio relative to the pattern insulation film.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A method for manufacturing a semiconductor device including a lower layer wiring and an interlayer insulation film, which is formed on the lower layer wiring and has a connection hole connected with the lower layer wiring, the method comprising the steps of:

forming the connection hole by etching part of the interlayer insulation film, through chemical reaction or physical reaction until part of a surface of the lower layer wiring is exposed;

etching part of the lower layer wiring under a first etching condition through physical reaction in at least the vicinity of the lower layer wiring to form an etching inhibition film on part of the surface of the lower layer wiring and on a wall of the connection hole; and continuously performing etching under a second etching condition that guarantees a selective ratio relative to the lower layer wiring.

2. The method according to claim 1, wherein the etchings under the first and second etching conditions are a reactive ion etching that includes a physical reaction and a chemical reaction, and the first and second etching conditions are determined in accordance with ratio adjustment between the physical reaction and the chemical reaction.

3. The method according to claim 2, wherein the reactive ion etching chemically uses an active gas and an inert gas on the interlayer insulation film, and wherein the etching rate obtained when using the inert gas under the first etching condition is greater than the etching rate obtained when using the inert gas under the second etching condition.

4. The method according to claim 3, wherein the inert gas includes argon gas.

5. The method according to claim 1, wherein the lower layer wiring is formed from one of the group consisting of polycrystalline silicon, amorphous silicon, silicide, aluminum, aluminum alloy, tungsten, titanium, tantalum, and compounds of polycrystalline silicon, amorphous silicon, silicide, aluminum, aluminum alloy, tungsten, titanium, and tantalum.

6. A method for manufacturing a semiconductor device including a lower layer wiring and an interlayer insulation film, which is formed on the lower layer wiring and has a connection hole connected with the lower layer wiring, the method comprising the steps of:

forming the connection hole by etching part of the interlayer insulation film through chemical reaction or physical reaction until part of a surface of the lower layer wiring is exposed;

forming an etching inhibition film on part of the surface of the lower layer wiring and on a wall of the connection hole by etching part of the surface of the lower layer wiring through the physical reaction; and over-etching part of the interlayer insulation film that is adjacent to the lower layer wiring.

7. The method according to claim 6, wherein the etching rate obtained during the physical reaction is greater than the etching rate obtained during the over-etching.

8. The method according to claim 7, wherein the step of over-etching part of the interlayer insulation film includes over-etching part of the interlayer insulation film under an etching condition that guarantees a selective ratio relative to the lower layer wiring.

9. A method for manufacturing a semiconductor device, the method comprising the steps of:

preparing a wiring layer;

forming an interlayer insulation film on the wiring layer, wherein the interlayer insulation film includes an upper layer, a lower layer and an intermediate layer formed between the upper and lower layers;

forming a connection hole connected with the wiring layer in the interlayer insulation film;

forming an air layer by etching the intermediate layer through the connection hole while guaranteeing a selective ratio relative to the upper layer and the lower layer;

forming an insulation wall on a surface that defines the connection hole; and forming the connection wire in the connection hole adjacent to the insulation wall.

10. The method according to claim 9, wherein the step for forming the insulation wall includes:

depositing an insulation film on the interlayer insulation film and in the connection hole; and performing anisotropic etching on the insulation film to form the insulation wall.

11. The method according to claim 9, wherein the intermediate layer of the interlayer insulation film includes a spin-on glass film, and the step for forming the air layer includes etching the intermediate layer with a solution containing fluorine.

12. The method according to claim 9, wherein the intermediate layer of the interlayer insulation film includes an organic insulation film, and the step for forming the air layer includes etching the intermediate layer with the plasma of oxygen gas.

13. A method for manufacturing a semiconductor device, the method comprising the steps of:

preparing a wiring layer;

forming an interlayer insulation film that includes a pattern insulation film, which has a predetermined pattern and is made of a material that differs from that of the interlayer insulation film;

forming a connection hole in the interlayer insulation film, wherein at least part of the connection hole is connected with the pattern insulation film and to the wiring layer;

forming an air layer by etching the pattern insulation film through the connection hole while guaranteeing a selective ratio relative to the interlayer insulation film;

forming an insulation wall on a surface that defines the connection hole; and forming a connection wire adjacent to the insulation wall in the connection hole.

14. The method according to claim 13, wherein the pattern insulation film includes an organic insulation film, and the step for forming the air layer includes etching the pattern insulation film with an organic solution or the plasma of oxygen gas.

15. The method according to claim 13, wherein the pattern insulation film includes an organic spin-on glass (SOG) film, and the step for forming the air layer includes etching the pattern insulation film with a hydroxylamine solution.

16. A method for manufacturing a semiconductor device, the method comprising the steps of:

preparing a wiring layer;

forming an interlayer insulation film that includes a pattern insulation film, which has a predetermined pattern and is made of a material that differs from that of the interlayer insulation film;

forming an opening in the interlayer insulation film that is connected with a lower surface of the pattern insulation film;

forming an air layer by etching the pattern insulation film through the opening while guaranteeing a selective ratio relative to the interlayer insulation film; and charging metal in the air layer and the opening.

* * * * *